United States Patent
Ramm

(10) Patent No.: US 6,916,739 B2
(45) Date of Patent: Jul. 12, 2005

(54) STRUCTURAL ELEMENT AND PROCESS FOR ITS PRODUCTION INCLUDING BONDING THROUGH AN AMORPHOUS HARD LAYER

(75) Inventor: Jürgen Ramm, Sevelen (CH)

(73) Assignee: Unaxis Balzers AG, Balzers (LI)

( * ) Notice: Subject to any disclaimer, the term of this patent is extended or adjusted under 35 U.S.C. 154(b) by 0 days.

(21) Appl. No.: 10/621,011

(22) Filed: Jul. 16, 2003

(65) Prior Publication Data

US 2004/0087150 A1 May 6, 2004

Related U.S. Application Data

(63) Continuation of application No. 09/349,014, filed on Jul. 7, 1999, now abandoned.

(30) Foreign Application Priority Data

Jun. 28, 1999 (CH) .............................................. 1197/99

(51) Int. Cl.⁷ .......................... H01L 21/44; H01L 21/31; H01L 21/769
(52) U.S. Cl. ........................ 438/666; 438/761; 438/765; 438/771
(58) Field of Search ................................. 438/666, 761, 438/765, 771; 428/689, 698

(56) References Cited

U.S. PATENT DOCUMENTS

| | | | | |
|---|---|---|---|---|
| 3,615,942 A | * | 10/1971 | Blumenfeld et al. | 438/310 |
| 5,486,277 A | * | 1/1996 | Barbee et al. | 204/192.15 |
| 5,820,980 A | * | 10/1998 | Asakawa et al. | 428/332 |
| 6,033,482 A | * | 3/2000 | Parkhe | 118/728 |
| 6,335,569 B1 | * | 1/2002 | Joshi | 257/750 |
| 2002/0009621 A1 | * | 1/2002 | Finely et al. | 428/698 |
| 2002/0127845 A1 | * | 9/2002 | Farrar | 438/627 |

* cited by examiner

Primary Examiner—W. David Coleman
Assistant Examiner—William M. Brewster
(74) Attorney, Agent, or Firm—Notaro & Michalos PC

(57) ABSTRACT

A method for manufacturing structural elements provides a first part with a surface that is substantially copper and a second part with a surface of a metal. The surface of the first part is coated with a hard layer which is stable at a temperature of at least 80° C. and which, at this temperature, forms an oxygen diffusion barrier when exposed to ambient. The layer has a barrier effect similar to that of an aluminum oxide layer formed in a standard environment on aluminum. The surfaces are connected to each other by bonding with heating to at least 80° C.

30 Claims, 2 Drawing Sheets

STRUCTURAL ELEMENT AND PROCESS FOR ITS PRODUCTION INCLUDING BONDING THROUGH AN AMORPHOUS HARD LAYER

CROSS-REFERENCE TO RELATED APPLICATIONS

This is a continuation of application Ser. No. 09/349,014 filed Jul. 7, 1999, now abandoned, which claims priority on Swiss application 1197/99 filed Jun. 28, 1999, which priority claim is repeated here.

FIELD AND BACKGROUND OF THE INVENTION

The present invention relates in particular to the field of semiconductor industry and in particular to the field of "Assembling and Packaging (A+P)".

It is emphasized, however, that the present invention can also be applied to other fields where it is desired to realize electrical bond connections on copper surfaces.

Therefore, if the present invention is described in the context of the semiconductor industry the invention should not be understood as to be limited to that field. The same problems occur in other fields and the invention can equally be applied therein.

It is common in the semiconductor industry to connect two or more parts, by bonding or by the so-called process of "wire bonding." One of the parts is customarily a wire and/or comprised of aluminum. The "wire bonding" of parts to form aluminum oxide layers at standard atmosphere is well known in the art. To establish a high quality intermetallic connection between metals, such as between aluminum and gold, where such connection has the lowest possible electrical resistance and is stable and electrically and mechanically reliable, it is necessary to create the connection while heating the parts to at least 80° C., or preferably higher.

However, it is well known that aluminum is not a preferred metal for conducting electricity.

Copper provides a substantially better electrical conductivity and the possibility of smaller dimensioning of current-conducting parts, such as metallic conductors on chips and wire contacts. A great need exists, in particular in the semiconductor industry, to use electrical contact junctions bonded with current-conducting copper parts, as disclosed in Terrence Thompson, "Copper IC Interconnect Update", HDI, Vol. 2, No. 5, May 1999, p. 42.

However, problems present with the prior art metal bonding processes for copper-gold wire bond systems exist, as disclosed in George G. Harmann, "Wire Bonding in Microelectronics", McGraw-Hill, 1997, pp. 138–140.

This publication explains (on p. 171) why the bonding of aluminum is relatively free of problems, specifically because a hard brittle oxide layer is formed on it which is forced open through the bonding process. In comparison, softer oxides such as copper and nickel oxide would reduce the capacity for bonding.

Table I-3 "Reversing the Bonded Metallurgical Interface" (p. 128) of the Harmann publication also reveals in principle that hard oxides on soft metals facilitate bonding. This is consistent with the disclosures on pp. 197, 198, according to which it is established that during the bonding, brittle films are forced open and flushed into so-called "disposal zones". This permits establishing satisfactory ultrasonic and thermionic bond connections through relatively thick layers. The bondability through 2.5 nm CVD deposited oxides is described as being unchanged compared to the bondability of pure contact pads.

In summary, with respect to the semiconductor industry, the bonding of aluminum to copper in the case of conductors permits a further miniaturization of the chips. The fabrication process of chips with copper conductors is well known. Difficulties occur if bond connections of copper contacts of the chips are to be realized to the "chip carrier" (wire bonding, flip-chip technique). In contrast to the aluminum oxide forming on aluminum, which is a hard, thin, oxygen-blocking layer which protects the subjacent metal against further oxidation or contamination at the conventional temperatures during the wire bonding, copper oxide is soft and permits neither the sudden breakthrough during bonding, as does the aluminum oxide, whereby a flux-free welding or soldering connection can be established. Nor does copper oxide form an oxygen diffusion barrier at bonding temperatures.

SUMMARY OF THE INVENTION

The present invention proposes a structural element, and the process for making the same, with at least one connection having at least one metal part comprising substantially copper and a second part comprising a metal. The connection is mechanically and electrically faultless. Forth is purpose, structural elements according to the invention are disclosed. Preferred embodiments of these structural elements are also claimed.

The second part of the structural element can also, at least substantially, comprise copper, or preferably comprises substantially gold or aluminum. The second part is coated according to the described manner.

According to the invention, the copper part(s) (if two copper parts are to be connected by bonding) is coated with a hard layer which is stable at a temperature of at least 80° C. An oxygen diffusion barrier is formed at this temperature at least approxmately as well, if not better, than would an aluminum oxide layer which forms on aluminum in a standard environment. The two parts are connected by means of bonding while heating them to at least 80° C. The further preferred embodiments analogously also apply to the structural elements according to the invention.

According to another feature of the invention, a layer is deposited on the two parts to be bonded. The layer is preferably stable at a temperature of at least 100° C., more preferably up to at least 150° C., and even more preferably up to at least 300° C. The bonding process occurs with the heating of the bonded parts to at least said temperature. However, this does not mean that if the layer is stable even at high temperatures, for example, 350° C., the bonding also occurs at this temperature. Bonding can also occur at lower temperatures, but at least at 80° C., preferably at least at 150° C., even more preferably at least at 200° C.

In a further preferred embodiment, the deposited layer has mechanical and thermal properties as well as oxygen diffusion behavior, which is at least approximately equivalent to, if not better than, those qualities of an aluminum oxide layer which forms on aluminum in a standard environment.

In view of the preferred application field, namely the semiconductor technology, at least one of the parts is structured as a wire and the method of "wire bonding" is used.

Furthermore, the layer is deposited as an electrically conducting or as an electrically insulating layer. Its property in this regard can positively be utilized, i.e., the layer can be used as insulation or conductor layer.

The following materials or mixtures thereof are preferable as materials for said layer:

a) $SiO_x$ with $1.5 \leq x \leq 2$, preferably with $1 < x < 2$, b) TaSiN, preferably $Ta_xSi_yN_z$ with $35 \leq x \leq 55$ $12 \leq y \leq 18$ $32 \leq z \leq 48$, with $x+y+z=100$, in particular preferred $Ta_{45}Si_{15}N_{40}$ c) TiN
d) AlO
e) TiSiN
f) TaN
g) SiN, preferably $Si_3N_4$
h) WSiN
i) ReO
k) PdO
l) ZrO
m) YO
n) ZrN
o) NbN
p) VN
q) if need be CuN.

Said layer is further preferably deposited in a vacuum deposition process such as, for example, in a CVD, a PVD, a PECVD, a PEPVD process or through plasma polymerization.

Depending on the history of the involved part, substantially comprising copper, it is further proposed to purge it before depositing the layer, preferably by treatment with a hydrogen plasma or in a hydrogen-nitrogen plasma.

It is further preferred to deposit the layer at a thickness d of at least 1.5 nm, preferably of at least 2.0 nm, in particular in a range of $2.0\ \text{nm} \leq d \leq 15\ \text{nm}$, in particular at $2.5\ \text{nm} \leq d \leq 3.5\ \text{nm}$.

The thickness of the layer is limited towards the bottom by the requirements made of it as oxygen diffusion barrier. Towards the top, the thickness to be provided is primarily limited by the capacity of forcing open the bonding to be carried out.

In order to optimize the required effect of the layer as an oxygen diffusion barrier, it is further proposed to implement the layer so as to be amorphous under X-rays or glass-like. This requirement also defines a lower limit for the layer thickness d, which can consequently not be implemented as atomic monolayer or, in this case, would no longer be oxygen-tight. Furthermore, the layer can comprise a material with oxygen getter effect, for example, a substoichiometric oxide, in particular $SiO_x$ with $x<2$.

In view of the possibility of implementing the layer provided according to the invention as an electrically conducting or electrically insulating layer, the layer as a conductor layer or an insulation layer.

BRIEF DESCRIPTION OF THE DRAWINGS

The invention will subsequently be explained by example in conjunction with tests and their results, as well as with reference to Figures. Therein depict.

DESCRIPTION OF THE PREFERRED EMBODIMENTS

Figure 1:
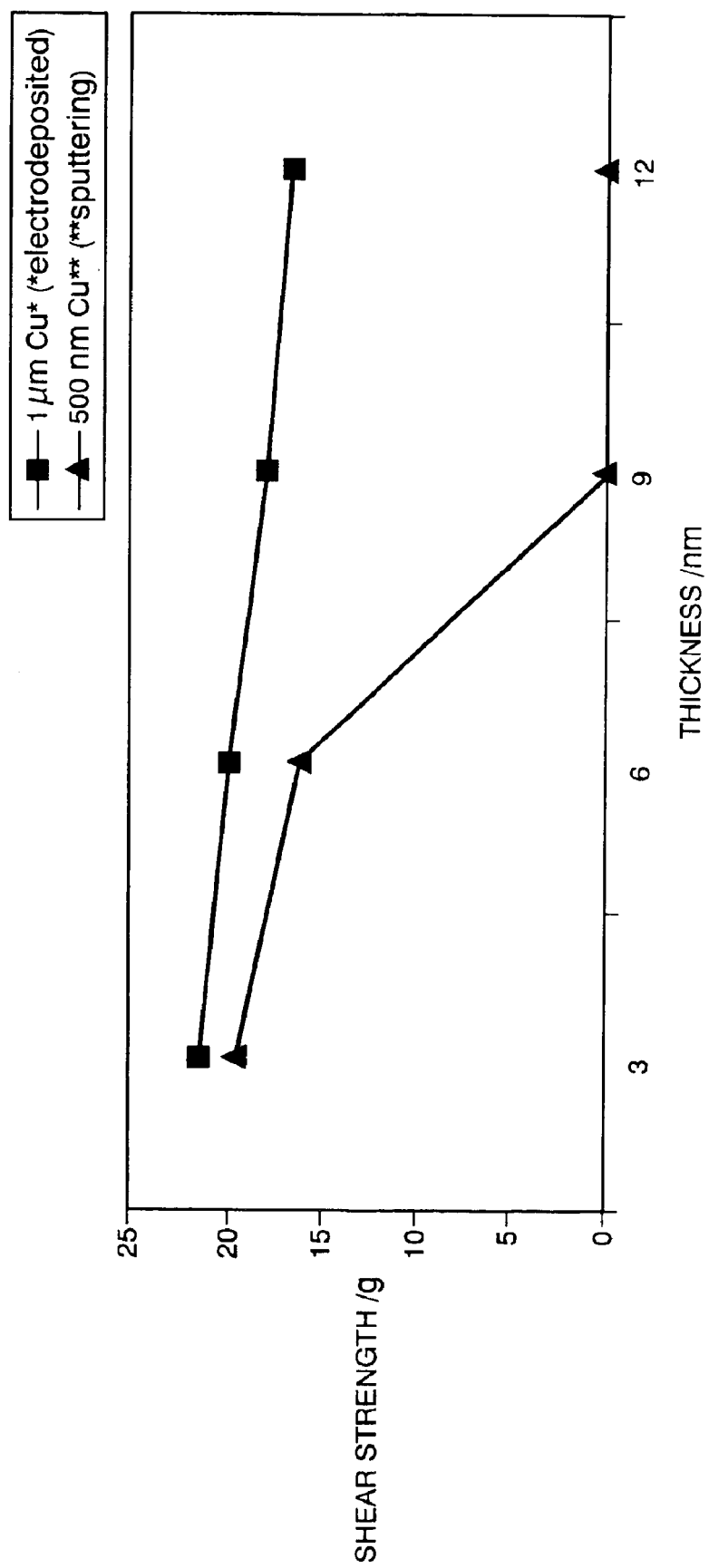
FIG. 1 is a graph plotting the shear strength of a bond connection through an $SiO_2$ layer with the thickness of a copper layer deposited electrolytically with a 1 µm thickness or by sputtering a layer with 500 nm thickness.

A wafer coated with a copper layer acts as the substrate for tests using the claimed process. The copper layer has thicknesses of 500 nm and 1000 nm.

Thinner copper layers in the approximate range of 500 nm were deposited by means of sputtering. Thicker copper layers in the range of 1,000 nm were deposited electrolytically. In some experiments, a purging of the copper surface was carried out in a hydrogen plasma. However, it was found that surface purging did not result in an increase of the tensile loading capacity compared to wafers with identical coating in which no purging was carried out. Consequently, the need for a preferred purging cannot be demonstrated experimentally. However, consideration should be given to the fact that under production conditions, the copper surfaces are exposed to diverse environmental conditions and that in all probability it is entirely advantageous to carry out said purging step before the deposition of the layer according to the invention and be such in order to create identical starting conditions for the coating.

A multiplicity of different materials with different layer thickness were studied and each bonded at different bonding temperatures onto gold wires with a diameter of 1.0 mil.

TABLE 1

| NO. | $SiO_2$ (1) | | $SiO(H)$ (2) | | $SiN(H)$ (3) | | $Si_3N_4$ (4) | | $CrO_2$ (5) | | $Nb_2O_5$ (5) | | $Ta_{45}Si_{15}N_{40}$ (7) | | TiN (8) | |
|---|---|---|---|---|---|---|---|---|---|---|---|---|---|---|---|---|
| d | 3 nm | 7 nm | 3 nm | 7 nm | 3 nm | 7 nm | 3 nm | 7 nm | 3 nm | 7 nm | 3 nm | 7 nm | 3 nm | 7 nm | 3 nm | 7 nm |
| 40° C. | v | v | v | v | v | (v) | v | (v) | v | (v) | v | (v) | v | (v) | v | (v) |
| 200° C. | v | v | — | — | — | — | v | v | — | — | — | — | v | (v) | v | (v) |

"v"—bondable
"(v)"—limited bondability
"—"—not bondable

Table 1 summarizes the results for the eight listed hard layer materials No. 1 to No. 8 each at two layer thicknesses and tested at the bonding temperatures of 40° C. and 200° C. At bonding temperatures of 200° C. targeted for the above stated reasons, only $SiO_2$, $Si_3N_4$, $Ta_{45}Si_{15}N_{40}$ and TiN lead to bondability. Layer thicknesses in the range of 3 nm tend to yield better bondability than greater layer thicknesses. At temperatures below 60° C., at which the copper oxidation is of no significance, only the layer hardness in connection with its thickness d appears to be critical The layer must not be too thick or otherwise it cannot be broken through during the wire bonding. At increased temperatures above 80° C., the soft greasy copper oxide is formed and a layer that is only brittle and hard of corresponding thickness is no longer sufficient. The layer must be capable of effectively preventing the oxidation of the copper at bonding temperatures, with which at higher temperatures the effect of the layer applied according to the invention as an oxygen diffusion barrier becomes increasingly important.

In Table 2 the deposition and the essential process conditions for the layers No. 1 to 8 according to Table 1 are summarized.

TABLE 2

| No. | | |
|---|---|---|
| (1) | Deposition by sputtering | Si target, $Ar/O_2$ mixture $3 \times 10^{-3}$ mbars |
| (2) | Plasma polymerization | dimethyl diethoxy silane $Si(CH_3)_2(OC_2H_5)_2$, $10^{-2}$ mbars |
| (3) | Deposition by sputtering | Si target, $Ar/N_2$ mixture $10^{-2}$ mbars |
| (4) | Ion plating | Si vaporization, $Ar/N_2$ mixture $5 \times 10^{-3}$ mbars |
| (5) | Deposition by sputtering | Cr target, $Ar/O_2$ mixture $5 \times 10^{-3}$ mbars |
| (6) | Deposition by sputtering | Nb target, $Ar/O_2$ mixture $4 \times 10^{-3}$ mbars |
| (7) | Deposition by sputtering | Ta—Si target, $Ar/N_2$ mixture $5 \times 10^{-3}$ mbars |
| (8) | Ion plating | Ti vaporization, $Ar/N_2$ mixture $5 \times 10^{-3}$ mbars |

Subsequently strip-off tests were carried out on the successfully bonded connections with the layers No. 1, 4 and 7 according to Table 1.

The results show that only those layers exhibit good mechanical behavior which are stable at the bonding temperature which, in any case, is greater than 80° C. and, as shown, is 200° C. Suitable are primarily layers which are stably amorphous (amorphous under X-rays with crystal sizes $\leq 3$ nm) and at said temperatures preferably remain stable even to 300° C. Apart from the materials No. 1, 4, 7, 8 of Table 1, among them are also TiN, further $SiO_x$ (substoichiometric silicon oxide) aluminum oxide (preferably substoichiometrically), TiSiN, TaN, WSiN, ReO, PdO, ZrO, YO, ZrN, NbN, VN, if need be also CuN.

By using substoichiometric $SiO_x$ or fundamentally a material with oxygen getter effect, for example a substoichiometric oxide, the effect of the layer material as oxygen diffusion barrier can be increased.

In Table 3, shown below, the resulting tensile loading capacities of the resulting bond connections according to experiments No. 1, 7 and 4 are summarized.

TABLE 3

| Hard Layer | Thickness d in nm | Strip-off force in g | No. |
|---|---|---|---|
| $SiO_2$ | 7 | 17.46 | (1) |
| $Ta_{4.5}Si_{2.5}N_3$ | 3 | 14.7 | (7) |
| $Si_3N_4$ | 3 | 14.2 | (4) |

In FIG. 1, as a function of the deposited layer thickness for a $SiO_2$ layer, with bonding at a temperature of 200° C., depending on the layer thickness d the resulting strip-off loading capacities are plotted of a copper layer of 1000 nm and one of 500 nm. The resulting bond connection becomes optimal and substantially independent of variations of d and the copper layer thickness with thin layer thicknesses of the hard layer.

Figure 2:
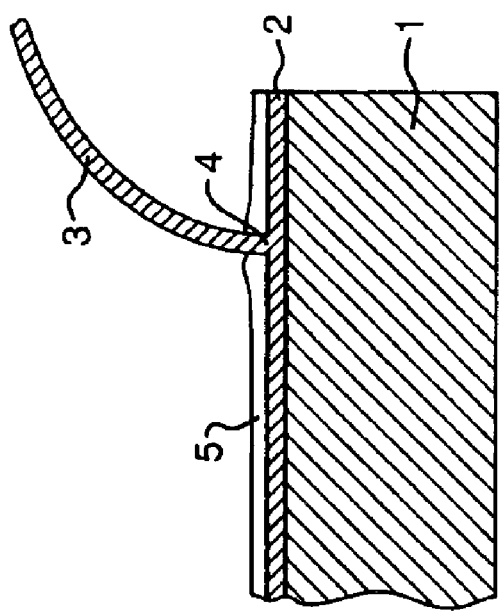
FIG. 2 is a schematic of a bond connection provided on the structural element according to the invention.

FIG. 2 schematically shows a bond connection region on a structural element according to the invention. In particular, FIG. 2 depicts:
1: a substrate 1
2: a layer at least predominantly comprising copper
3: a further part, in particular wire 3, connected with the copper layer 2 through bonding and forming an intermetallic connection at 4
4: the hard layers provided according to the invention forced open through the bonding process in the region of the generated bond connection.

Figure 3:
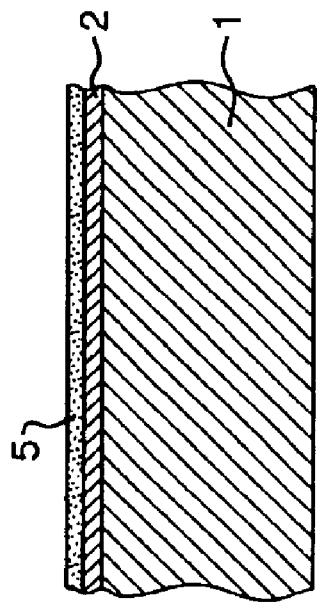
FIG. 3 is a view similar to FIG. 2 of an intermediate step in the process of the invention.

FIG. 3 uses the same reference numerals to denote the same parts and shows the step before the bonding step that results in the structure of FIG. 2.

With the present invention the utilization of current standard equipment for wire bonding continues to be ensured for copper technology, for example in the chip fabrication. This equipment operates at bonding temperatures far above 80° C.

What is claimed is:
1. A method for manufacturing a structural element comprising:
   providing a first part with a surface substantially of copper and adapted to be mechanically and electrically connected to a metal surface of a second part through a hard layer deposited on said surface;
   depositing hard layer on said surface of said first part, said hard layer consisting of at least one of the following materials;
   a) $SiO_x$ with $1.5 \leq x \leq 2$;
   b) TaSiN;
   c) TiN:
   d) AlO;
   e) TiSiN;
   f) TaN;
   g) SiN;
   h) WSiN;
   i) ReO;
   j) PdO;
   k) ZrO;
   l) YO;
   m) ZrN;
   n) NbN;
   o) VN;
   p) CuN;
   whereby said hard layer is amorphous under X-rays; and further comprising the steps of providing the second part with the surface of a metal, and connecting said first part with said second part by bonding said surface of said first part to said surface of said second part through the hard layer.

2. The method of claim 1 further comprising the step of depositing said hard layer so that said hard layer is stable to at least 80° C.

3. The method of claim 1 further comprising the step of depositing said hard layer so that said hard layer is stable to at least 100° C.

4. The method of claim 1 further comprising the step of depositing said hard layer so that said hard layer is stable to at least 150° C.

5. The method of claim 1 further comprising the step of depositing said hard layer so that said hard layer is stable to at least 200° C.

6. The method of claim 1 further comprising the step of depositing said hard layer so that said hard layer is stable to at least 300° C.

7. The method of claim 1 wherein said surface of said second part substantially consists of copper.

8. The method of claim 1 wherein the surface of said second part consists of gold and of aluminum.

9. The method of claim 1 wherein at least one of said first part or said second part is a wire.

10. The method of claim 1 further comprising the step of depositing said hard layer by a vacuum deposition process.

11. The method of claim 1 further comprising the step of cleaning said surface of said first part before depositing said hard layer.

12. The method of claim 11 wherein said cleaning is by a treatment in a hydrogen plasma or in a nitrogen/hydrogen plasma.

13. The method of claim 1 further comprising depositing said hard layer with a thickness of at least 1.5 nm.

14. The method of claim 13 further comprising depositing said hard layer with a thickness of at least 2 nm.

15. The method of claim 1 further comprising the step of depositing said layer with a thickness d which is in the range of $2.0 \text{ nm} \leq d \leq 10 \text{ nm}$.

16. The method of claim 1, wherein said material of said hard layer comprises oxygen in a substoichiometric ratio.

17. The method of claim 1, wherein said step of depositing said hard layer comprises depositing a layer and treating said layer deposited in at least one of a nitrogen plasma and in ambient atmosphere.

18. The method of claim 1, wherein said material comprises $SiO_2$.

19. The method of claim 1, wherein said hard layer consists of $SiO_x$ and is deposited by sputtering.

20. The method of claim 19 further comprising the step of depositing said Si by sputtering.

21. The method of claim 1 wherein depositing said hard layer comprises depositing a layer of Si and treating said layer of Si by a thermical treatment in ambient atmosphere.

22. The method of claim 1, wherein said depositing comprises depositing a metallic layer and oxidizing said metallic layer.

23. The method of claim 22 further comprising the step of oxidizing by at least one of the following parameters:

thickness of the layer;

temperature during oxidizing; and the atmosphere wherein said oxidizing is performed.

24. The method of claim 1, wherein said material comprises $Ta_xSi_yN_z$ and wherein x is in the range $35 \leq x \leq 55$; y is in the range $12 \leq y \leq 18$; and z is in the range $32 \leq z \leq 48$ with $x+y+z=100$.

25. The method of claim 1, wherein said material comprises $Ta_{45}Si_{15}N_{40}$.

26. The method of claim 1, wherein said material comprises $Si_3N_4$.

27. The method of claim 1 further comprising depositing said hard layer as an electrically insulating layer.

28. The method of claim 1 further comprising the step of depositing said hard layer as an electrically conductive layer.

29. The method of claim 1 further comprising the step of selecting said hard layer to be of one of said materials.

30. The method of claim 1 wherein said layer is a functional layer of a function of said element.

* * * * *